(12) United States Patent
Cho et al.

(10) Patent No.: US 11,901,420 B2
(45) Date of Patent: Feb. 13, 2024

(54) MANUFACTURING METHOD FOR GATE ELECTRODE AND THIN FILM TRANSISTOR AND DISPLAY PANEL

(71) Applicants: Beihai HKC Optoelectronics Technology Co., Ltd., Beihai (CN); HKC CORPORATION LIMITED, Shenzhen (CN)

(72) Inventors: En-Tsung Cho, Beihai (CN); Yuming Xia, Beihai (CN); Wei Li, Beihai (CN)

(73) Assignees: BEIHAI HKC OPTOELECTRONICS TECHNOLOGY CO., LTD., Beihai (CN); HKC CORPORATION LIMITED, Shenzhen (CN)

( * ) Notice: Subject to any disclaimer, the term of this patent is extended or adjusted under 35 U.S.C. 154(b) by 238 days.

(21) Appl. No.: 17/383,394

(22) Filed: Jul. 22, 2021

(65) Prior Publication Data

US 2022/0037476 A1 Feb. 3, 2022

(30) Foreign Application Priority Data

Jul. 30, 2020 (CN) .......................... 202010752766.0

(51) Int. Cl.
*G02F 1/1343* (2006.01)
*G02F 1/1368* (2006.01)
*H01L 29/40* (2006.01)
*C23C 14/14* (2006.01)
*C23C 14/35* (2006.01)
(Continued)

(52) U.S. Cl.
CPC ............ *H01L 29/401* (2013.01); *C23C 14/14* (2013.01); *C23C 14/35* (2013.01); *C23C 14/5873* (2013.01); *C23C 16/14* (2013.01); *C23C 16/16* (2013.01); *C23C 16/45527* (2013.01); *C23C 16/45553* (2013.01); *C23C 16/56* (2013.01); *C23C 28/023* (2013.01); *H01L 27/1214* (2013.01); *H01L 29/42384* (2013.01);
(Continued)

(58) Field of Classification Search
CPC ............... H01L 29/401; H01L 27/1214; H01L 29/42384; H01L 29/4908; C23C 14/14; C23C 14/35; C23C 14/5873; C23C 16/14; C23C 16/16; C23C 16/45527; C23C 16/45553; C23C 16/56; C23C 28/023; G02F 1/13439; G02F 1/1368
USPC ....................................................... 349/42–46
See application file for complete search history.

(56) References Cited

U.S. PATENT DOCUMENTS

2004/0087136 A1 5/2004 Wu et al.
2015/0034942 A1* 2/2015 Kim .................. H01L 29/78696
257/43
(Continued)

FOREIGN PATENT DOCUMENTS

CN 1584720 A 2/2005
CN 103811327 A 5/2014
(Continued)

*Primary Examiner* — Charles S Chang

(57) ABSTRACT

The present application discloses a manufacturing method for a gate electrode and a thin film transistor, and a display panel, including: depositing an aluminum film on a substratum by physical vapor deposition; depositing a molybdenum film over the aluminum film by atomic layer deposition; and etching the aluminum film and the molybdenum film to form the gate electrode of a predetermined pattern.

13 Claims, 4 Drawing Sheets

(51) Int. Cl.
    *C23C 14/58*       (2006.01)
    *C23C 16/14*       (2006.01)
    *C23C 16/16*       (2006.01)
    *C23C 16/455*     (2006.01)
    *C23C 16/56*       (2006.01)
    *C23C 28/02*       (2006.01)
    *H01L 27/12*       (2006.01)
    *H01L 29/423*     (2006.01)
    *H01L 29/49*       (2006.01)

(52) U.S. Cl.
    CPC ........ H01L 29/4908 (2013.01); *G02F 1/1368* (2013.01); *G02F 1/13439* (2013.01)

(56) References Cited

U.S. PATENT DOCUMENTS

| | | | |
|---|---|---|---|
| 2015/0325467 A1 | 11/2015 | Zhang et al. | |
| 2016/0027927 A1* | 1/2016 | Li | H10N 30/10516 |
| | | | 438/158 |
| 2020/0287049 A1* | 9/2020 | Jang | H01L 29/41733 |

FOREIGN PATENT DOCUMENTS

| | | | |
|---|---|---|---|
| CN | 106299153 A | 1/2017 | |
| CN | 106684037 A | 5/2017 | |
| CN | 110310891 A | 10/2019 | |

\* cited by examiner

MANUFACTURING METHOD FOR GATE ELECTRODE AND THIN FILM TRANSISTOR AND DISPLAY PANEL

The present application claims priority to Chinese Patent Application No. 202010752766.0, filed Jul. 30, 2020, which is hereby incorporated by reference herein as if set forth in its entirety.

TECHNICAL FIELD

The present application relates to the field of display technologies, and in particular, to a manufacturing method for a gate electrode and a thin film transistor, and a display panel.

BACKGROUND

The statements herein merely provide background information related to the present application and do not necessarily constitute the conventional art.

A TFT-LCD (Thin Film Transistor-Liquid Crystal Display) is a technology combining microelectronic technology and liquid crystal display technology, in which a TFT (Thin Film Transistor) is used as a switch of a pixel, and when the thin film transistor is turned on, a pixel electrode of the pixel receives a data voltage transmitted from a data line, which forms a voltage difference with a common electrode of an opposite substrate, such that liquid crystal molecules are deflected to display an image.

As consumers pursue greater definition, the pixel density (PPI, Pixel Per Inch) of the display panel is increased due to the increased resolution of the display panel. Accordingly, the number of thin film transistors per inch is increased, and the performance requirements for the thin film transistors are also increased. Therefore, how to provide a thin film transistor with both performance and productivity is an urgent technical problem to be solved.

SUMMARY

The application is intended to provide a manufacturing method of a gate electrode and a thin film transistor and a display panel, with improved performance and productivity.

The application discloses a manufacturing method for a gate electrode, including:

depositing an aluminum film on a substratum by physical vapor deposition;

depositing a molybdenum film over the aluminum film by atomic layer deposition; and etching the aluminum film and the molybdenum film to form the gate electrode of a predetermined pattern.

The application also discloses a manufacturing method for a thin film transistor, including:

S1: forming an aluminum film on a substrate through magnetron sputtering:

S2: placing the substratum with the aluminum film in a reaction chamber of an atomic layer deposition apparatus;

S3: continuously introducing a precursor for a preset time period into the atomic layer deposition apparatus, remaining for a preset time period after the introduction, and introducing an inert gas for purging;

S4: continuously introducing a reducing gas for a preset time into the atomic layer deposition apparatus, remaining for a preset time period after the introduction, and introducing the inert gas for purging:

S5: repeating the steps S3 and S4 for a preset number of times to form the molybdenum film;

S6: etching the aluminum film and the molybdenum film to form the gate electrode of a predetermined pattern; and S7: sequentially forming a gate insulating layer, an active layer, source and drain electrodes and a passivation layer above the gate electrode to form the thin film transistor.

The application also discloses a display panel, including a thin film transistor manufactured by the manufacturing method of the thin film transistor, and the display panel also includes a first substrate and a second substrate, the second substrate is disposed opposite to the first substrate; the second substrate is provided with a plurality of the thin film transistors; the second substrate includes a substratum; the thin film transistor includes a gate electrode, an insulating layer, a semiconductor layer, source and drain electrodes and a passivation layer, the insulating layer, the semiconductor layer, the source and drain electrodes and the passivation layer are sequentially positioned above the gate electrode, the gate electrode includes an aluminum film and a molybdenum film, the aluminum film is provided above the substrate, and the molybdenum film is provided above the aluminum film; and the aluminum film is formed by physical vapor deposition, and the molybdenum film is formed by atomic layer deposition.

This application uses two different methods to form two different layers of an aluminum film and a molybdenum film as first metal layer. The aluminum film is formed by physical vapor deposition, which is even and compact, improves the mobility of electron, and increases the electric conductivity. The molybdenum film adopts atomic layer deposition to give a stepped coverage rate, an even density and a stronger electric conductivity. Also, the molybdenum film features a flat surface, and stronger density and roughness, leaving no residue to following manufacture procedures, improving molybdenum film layer's interface characteristic; the high activity of aluminum can prevent the diffusion of aluminum; and as forming an aluminum film with atomic layer deposition requires a long period of time, separating the manufacture procedures can avoid affect on the productivity.

BRIEF DESCRIPTION OF DRAWINGS

The accompanying drawings, which are included to provide a further understanding of embodiments of the present application and constitute a part of the specification, illustrate embodiments of the application and, together with the text description, explain the principles of the application. Obviously, the drawings in the following description are merely some embodiments of the present application, and those skilled in the art can obtain other drawings according to the drawings without any inventive labor. In the drawings.

DETAILED DESCRIPTION OF EMBODIMENTS

Figure 1:
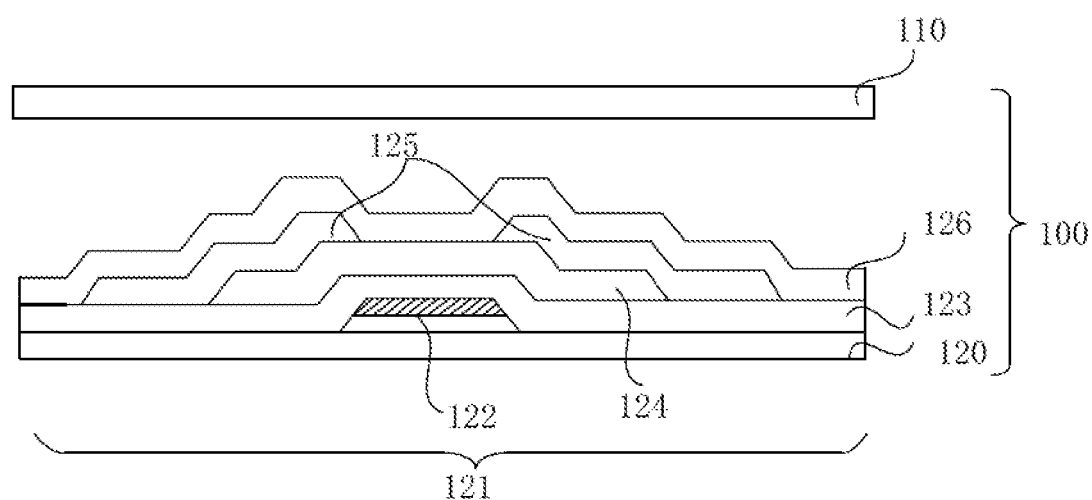
FIG. 1 is a cross-sectional view of a display panel according to one embodiment of the present application.

It should be understood that the terminology, specific structural and functional details disclosed are merely exemplary for the purpose of describing specific embodiments. However, the present application may be embodied in many alternative forms and should not be construed as being limited to the embodiments set forth herein.

In the description of the present application, the terms "first" and "second" are only for the purpose of description and cannot be construed to indicate relative importance or imply an indication of the number of technical features indicated. Therefore, unless otherwise stated, a feature defined as "first" and "second" may explicitly or implicitly include one or more of the features; "multiple" means two or more. The term "include" and any variations thereof are intended to be inclusive in a non-closed manner, that is, the presence or addition of one or more other features, integers, steps, operations, units, components and/or combinations thereof may be possible.

In addition, the terms "center", "transverse", "up", "down", "left", "right". "vertical", "horizontal", "top", "bottom", "inner", "outer" and the like for indicating an orientation or positional relationship are based on the description of the orientation or relative positional relationship shown in the accompanying drawings, and are only simplified description facilitating description of the application, and are not intended to indicate that the device or element referred to must have a particular orientation, be configured and operated in a particular orientation, and therefore cannot be construed as limiting the present application.

In addition, unless expressly specified and defined otherwise, the terms "mount", "attach" and "connect" are to be understood broadly, for example, it can be a fixed connection, a detachable connection, or an integral connection; it can be an either mechanical connection or an electrical connection; it can be a direct connection or an indirect connection through an intermediate medium, or an internal connection between two elements. For those skilled in the art, the specific meaning of the above terms in this application can be understood according to the specific circumstances.

The inventor attempted to manufacture gate electrodes by PVD (Physical Vapor Deposition) to give deposited gate electrodes having a stack-up structure of Mo/Al/Mo, Mo/Al, or Al/Mo, etc. The inventor found that if a plurality of the metal film layers are deposited by PVD, the metal properties are hardly adjusted to produce uniform film layers. As such, the resulting film layers may have uneven surfaces and insufficient contact with the next manufacture procedure, thereby decreasing the conductivity. For this, the inventor also attempted to manufacture stack-up structure of Mo/Al/Mo, Mo/Al or Al/Mo by ALD (atomic layer deposition), but found that if a plurality of metal film layers are deposited by ALD (Atomic Layer Deposition) since the film Layer is too thick, especially the required aluminum Layer is thick, the use of ALD may be time-consuming and low in production efficiency, affecting the productivity due to thick film layers and especially thick Al layers.

The inventor has improved such aspects to give the following solutions:

The present application will now be described in details by reference to the accompanying drawings and optional embodiments.

FIG. 1 is a cross-sectional view of a display panel according to one embodiment of the present application. The embodiment of the present application discloses a display panel 100, the display panel 100 including: a first substrate 110 and a second substrate 120, the first substrate 110 and the second substrate 120 are disposed opposite, a thin film transistor 121 is formed on the second substrate 120, and the thin film transistor 121 includes a gate electrode 122, an insulating layer 123, a semiconductor layer 124, source and drain electrodes 125 and a passivation layer 126. The second substrate 120 includes a substratum 1201; the insulating layer 123, the semiconductor layer 124, the source and drain electrodes 125, and the passivation layer 126 are sequentially positioned above the gate electrode 122, the gate electrode 122 includes an aluminum film 1221 and a molybdenum film 1222, the aluminum film 1221 is provided above the substrate 1201, and the molybdenum film 1222 is provided above the aluminum film 1221; and the aluminum film 1221 is formed by physical vapor deposition, and the molybdenum film 1222 is formed by atomic layer deposition.

Figure 2:
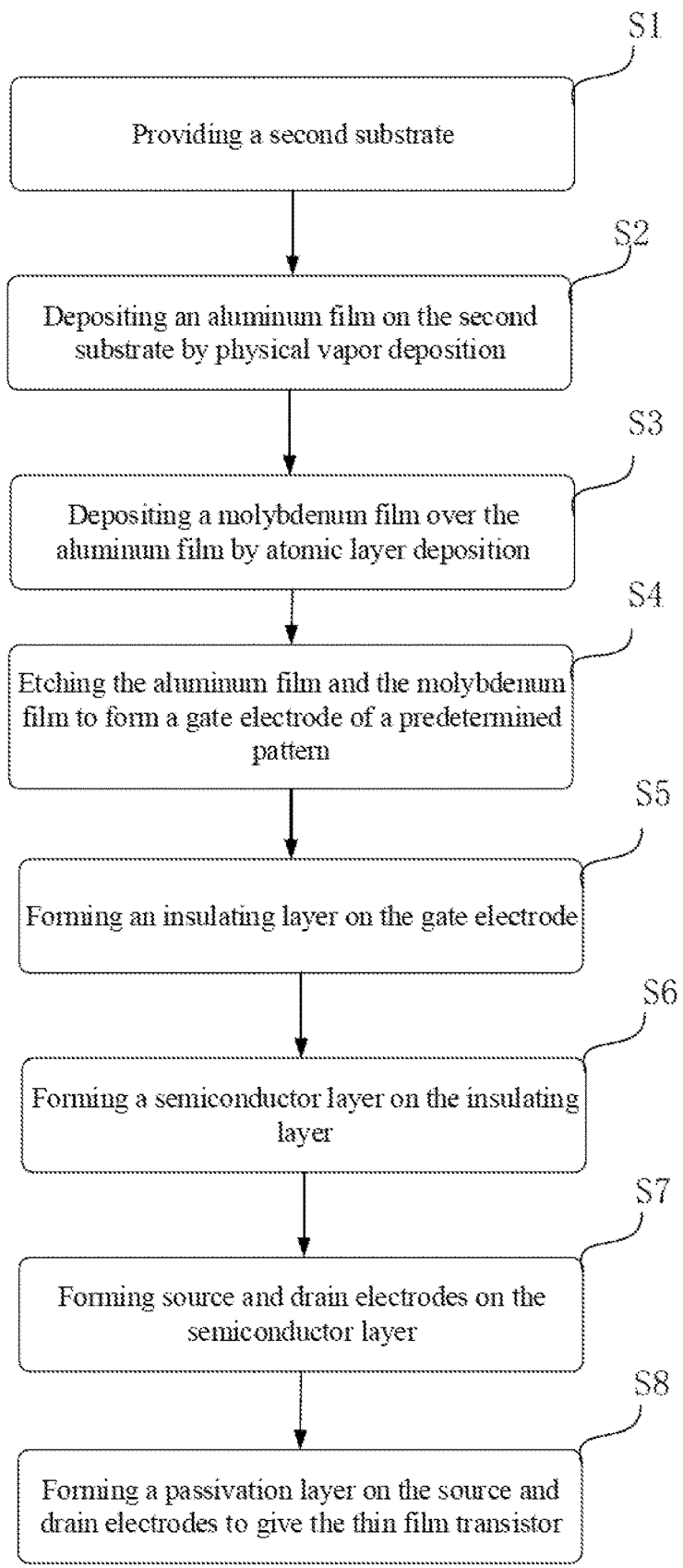
FIG. 2 is a flow chart of a method for manufacturing a thin film transistor according to one embodiment of the present application.

FIG. 2 is a flow chart of a method for manufacturing a thin film transistor according to one embodiment of the present application; the manufacturing method of the thin film transistor includes the steps:

S1: providing a second substrate;
S2: depositing an aluminum film on the second substrate by physical vapor deposition;
S3: depositing a molybdenum film over the aluminum film by atomic layer deposition;
S4: etching the aluminum film and the molybdenum film to form a gate electrode of a predetermined pattern;
S5: forming an insulating layer on the gate electrode;
S6: forming a semiconductor layer on the insulating layer;
S7: forming source and drain electrodes on the semiconductor layer; and
S8: forming a passivation layer on the source and drain electrodes to give the thin film transistor.

The gate electrode consists of a lower aluminum layer and an upper molybdenum layer.

The aluminum layer adopts PVD, in which the material, a solid or liquid surface is gasified into gaseous atoms or molecules, or a part of the gaseous atoms are ionized into ions in vacuum condition. Through low-pressure gas (or plasma) process, the preparation process is simple, consumes less materials, and produces even and compact films. As the main body of gate electrode, aluminum ensures the conductivity, reduces the RC delay time, and improves the transmission capability. The molybdenum film is formed above the aluminum film. As the ALD technology is a special chemical vapor deposition technology by forming a film through alternately introducing gaseous precursor pulses into a reaction chamber and chemical adsorption reaction on the surface of a deposition substrate, film layers formed by ALD have obvious advantages in uniformity, compactness, stepped coverage, thickness control and other aspects. As such, the protuberance problem of aluminum is improved, ensuring the flatness of the entire gate electrode and improving the film quality. Additionally, the time-consuming ALD is employed on part of the gate electrode, which reduces the period of manufacturing and improves production efficiency while ensuring the film quality. Secondly, due to a higher activity of aluminum compared with molybdenum, disposing a molybdenum film over the aluminum film can prevent the aluminum film from being oxidized. The molybdenum film layer serves as a protective layer as desired, separates the aluminum metal membrane under the protective layer from the air, prevents the problem of aluminum diffusion, and avoids any influence on the electric conductivity of aluminum.

The source and drain electrodes may also employ PVD for aluminum films, and ALD for a stack-up structure of molybdenum films. Moreover, a molybdenum/aluminium/molybdenum stack-up structure is also possible, in which ALD or PVD may be used for the lower molybdenum film. The production efficiency can be improved by adopting PVD, and the flatness and the film quality of the gate electrode are not significantly influenced if the PVD layer is disposed at a lower position.

Specifically, the insulating layer is a gate insulating layer, and the semiconductor layer is an active layer and an ohmic contact layer.

Figure 3:
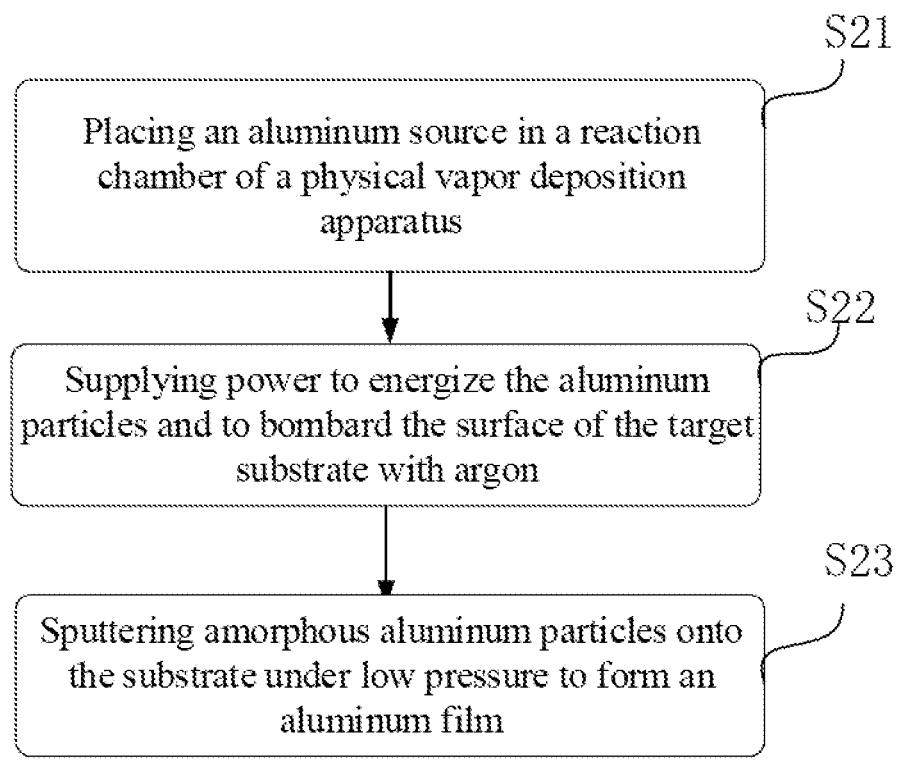
FIG. 3 is a flow chart of a method for manufacturing a gate electrode according to one embodiment of the present application.

Furthermore, FIG. 3 is a flowchart of a method for manufacturing a gate electrode according to one embodiment of the present application. S2, depositing an aluminum film on the substratum by physical vapor deposition, or more specifically, forming an aluminum film on a substrate through magnetron sputtering, includes:

S21: placing an aluminum source in a reaction chamber of a physical vapor deposition apparatus;

S22: supplying power to energize the aluminum particles and to bombard the surface of the target substrate with argon;

S23: sputtering aluminum particles onto the substrate under low pressure to form an aluminum film.

The aluminum film can be deposited by physical vapor deposition technology of magnetron sputtering. Magnetron sputtering is a sputtering method with a magnet added to the backside of a target material, and is a continuous discharge process. The power supply usually includes direct current power supply, radio frequency power supply, direct current pulse power supply and medium frequency power supply. The magnetron sputtering generally adopts direct current or alternating current sputtering, argon is usually used as a sputtering gas, and oxygen and water vapor can be introduced to control the performance of the deposited aluminum film. The low air pressure ensures a longer free stroke of aluminum particles, increased collision probability, ionization degree and density of target current, and a lower possibility of scattered sputtering atoms. As such, the working voltage is reduced, and the deposition rate of the aluminum film is increased, resulting in higher purity and quality of the aluminum film and a higher electron mobility. Films produced by this sputtering process features good uniformity, and can better satisfy large-scale manufacturing requirements and improve the productivity. Certainly, other processes for forming the aluminum film are also possible.

The thickness of the disposed aluminum layer is 3500 Å-4500 Å. As a conductor, the conductivity of aluminum is stronger than that of molybdenum, such that the electron mobility of aluminum is higher than that of molybdenum. The thickness of aluminum film is 3500 Å-4500 Å and is greater than that of molybdenum film, such that the conductivity, flatness and film quality of the gate electrode are guaranteed.

Figure 4:
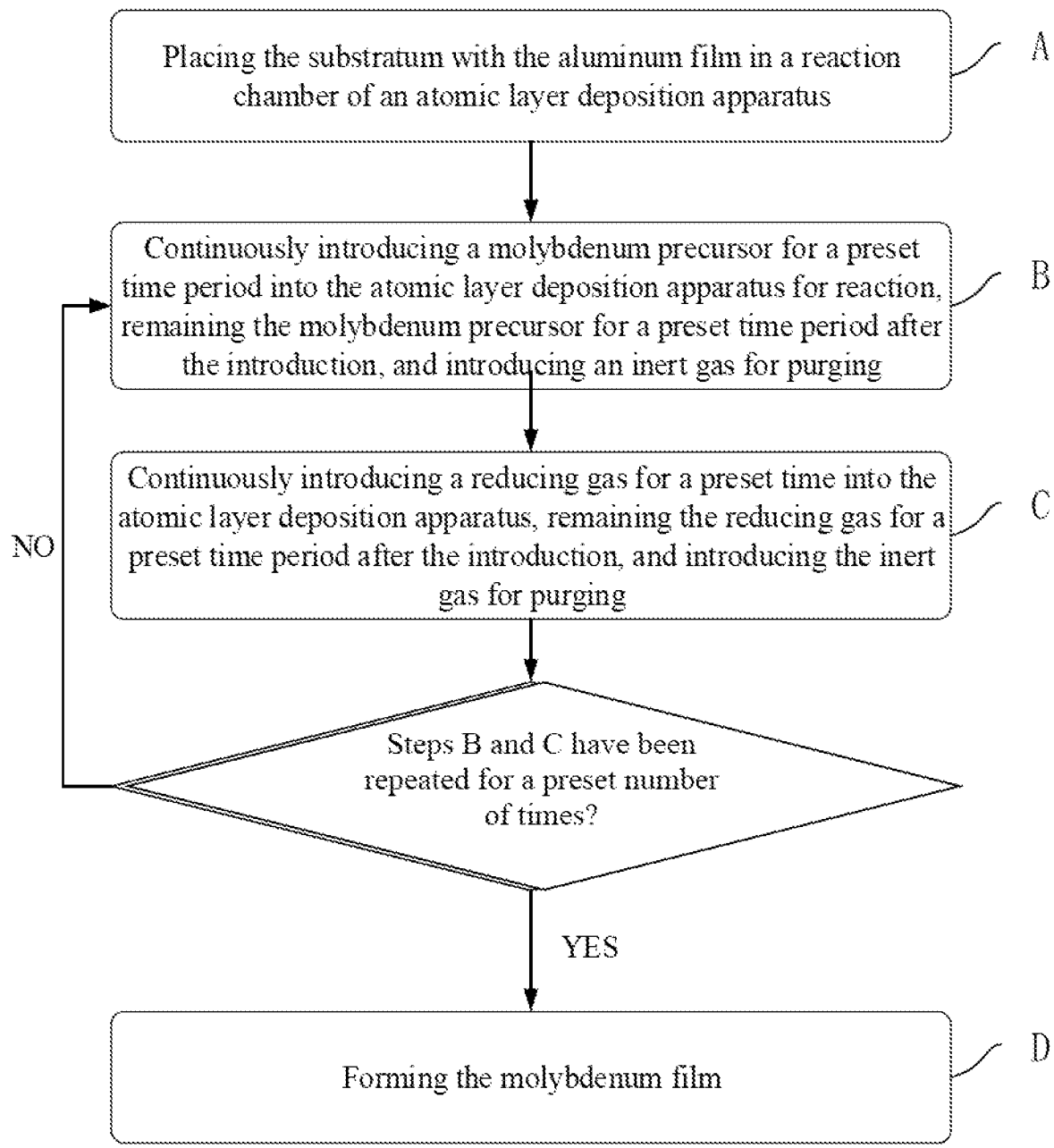
FIG. 4 is a flow chart of a method for manufacturing a gate electrode according to another embodiment of the present application.

Furthermore, FIG. 4 is a flowchart of a method for manufacturing a gate according to another embodiment of the present application. S3, depositing a molybdenum film over the aluminum film by atomic layer deposition, includes:

A: placing the substratum with the aluminum film in a reaction chamber of an atomic layer deposition apparatus;

B: continuously introducing a molybdenum precursor for a preset time period into the atomic layer deposition apparatus, remaining the molybdenum precursor for a preset time period after the introduction, and introducing an inert gas for purging;

C: continuously introducing a reducing gas for a preset time into the atomic layer deposition apparatus, remaining the reducing gas for a preset time period after the introduction, and introducing the inert gas for purging; and D: repeating the steps B and C for a preset number of times to form the molybdenum film.

Due to the stringent conductivity requirement on the top molybdenum film layer, and to reduce the influence on the next manufacture procedure by smoothing the surface, ALD can be employed. The atomic layer deposition apparatus is used for processing a molybdenum source. A molybdenum source precursor is introduced to form a desired layer of Mo$(CO)_6$ (molybdenum hexacarbonyl), and the step is repeated for each precursor. Finally, all the steps are repeated, such that the required atoms in each precursor are doped more evenly, deposited layers are uniform and compact, and the electron mobility is improved.

The thickness of the disposed molybdenum film is 100 Å-450 Å, the precursor is a molybdenum precursor, and the material includes at least one of molybdenum hexacarbonyl, molybdenum chloride and molybdenum fluoride.

The reducing gas includes plasma $H_2$ (hydrogen).

The inert gas includes at least one of argon and helium.

The preset time period for continuously introducing the molybdenum precursor is between 0.01 and 0.5 seconds, the preset time period for remaining the molybdenum precursor after the introduction is 2-20 s, the preset time period for introducing the reducing gas is between 0.005 and 0.3 seconds, and the time for purging is between 5 and 30 seconds. The preset number of cycles is 30-1000. Introducing and remaining for such time periods are repeated multiple times during the deposition of each atom, such that each molybdenum atom is more uniformly distributed on the deposition surface. Finally, all the steps are repeated multiple times, namely, the processed film layers are disposed in multiple layers. As such, molybdenum atoms are more uniformly distributed in the thickness direction, the density of the molybdenum film layer generated by the process is uniform, and the conductivity is higher. Certainly, the preset number of cycles can be 50, and the total time period can be reduced to increase the productivity. Furthermore, the molybdenum precursor is reduced to elemental molybdenum by reducing gas $H_2$ (hydrogen), and the reducing gas can be CO (carbon monoxide) and the like.

Specifically, the introducing rate of the molybdenum precursor is 20 sccm, and the molybdenum precursor and the reducing gas are introduced at the same rate, resulting in a robust deposition, and thereby avoiding uneven density among different layers due to the fact that gases with different rates are fed, or reduced quality of the molybdenum film or compromised uniformity and compactness of the molybdenum. Thus the uniformity and the stability of the molybdenum film are further improved.

More specifically, the temperature in the reaction chamber of the atomic layer deposition apparatus is 400-600° C., and the vacuum degree in the reaction chamber of the atomic layer deposition apparatus is 0.01-0.05 torr. In this temperature range, the deposition rate is relatively higher, and a temperature below or above the range will affect the compactness of deposition, the density of atoms and the compactness of a metal film. Various materials can be produced by controlling the number of cycles, as shown in Table 1:

TABLE 1

Workflow of ALD apparatus processing

| Serial number | Procedure | Formulation | Time (s) |
|---|---|---|---|
| 1 | Mo (molybdenum source) precursor (Dose1) | Mo(CO)$_6$ | 0.02 |
| 2 | Remaining time 1 (Reaciton1) | Mo(CO)$_6$ remaining time | 5 |
| 3 | Purge 1 (Purge1) | Ar purge | 10 |
| 4 | Reducing gas (Dose2) | Plasma H$_2$ | 0.02 |
| 5 | Remaining time 2 (Reaciton2) | Plasma H$_2$ remaining time | 5 |
| 6 | Purge 2 (Purge2) | Ar purge | 10 |
| 7 | Total cycle number (Goto1) | | 50 |
| 8 | End (End) | | |

It should be noted that, the limitation of the steps involved in this solution, without affecting the implementation of the specific solution, is not determined to limit the sequence of steps, and the previous steps may be executed first, later, or even simultaneously, and shall be deemed to fall within the scope of the present application as long as the solution can be implemented.

The technical solution of the present application can be applied to a wide variety of display panels, such as Twisted Nematic (TN) display panels, In-Plane Switching (IPS) display panels, Vertical Alignment (VA) display panels, Multi-domain Vertical Alignment (MVA) display panels, and other types of display panels, such as Organic Light-Emitting Diode (OLED) display panels.

The above content is a further detailed description of the present application in conjunction with specific optional embodiments, and it is not to be construed that specific embodiments of the present application are limited to these descriptions. For those of ordinary skill in the art to which this application belongs, a number of simple derivations or substitutions may be made without departing from the spirit of this application, all of which shall be deemed to fall within the scope of this application.

What is claimed is:

1. A manufacturing method for a gate electrode, comprising:
   depositing an aluminum film on a substratum by physical vapor deposition;
   depositing a molybdenum film over the aluminum film by atomic layer deposition; and
   etching the aluminum film and the molybdenum film to form the gate electrode of a predetermined pattern;
   wherein depositing the molybdenum film over the aluminum film by atomic layer deposition comprises:
   A: placing the substratum with the aluminum film in a reaction chamber of an atomic layer deposition apparatus;
   B: continuously introducing a molybdenum precursor for a preset time period into the atomic layer deposition apparatus, remaining the molybdenum precursor for a preset time period after the introduction, and introducing an inert gas for purging;
   C: continuously introducing a reducing gas for a preset time into the atomic layer deposition apparatus, remaining the reducing gas for a preset time period after the introduction, and introducing the inert gas for purging; and
   D: repeating the above operations B and C for a preset number of times to form the molybdenum film.

2. The manufacturing method for the gate electrode according to claim 1, wherein the thickness of the deposited aluminum film is 3500 Å-4500 Å.

3. The manufacturing method for the gate electrode according to claim 1, wherein the molybdenum precursor is at least one of molybdenum hexacarbonyl, molybdenum chloride, molybdenum fluoride; the reducing gas comprises a plasma H$_2$;
   the inert gas comprises at least one of argon and helium.

4. The manufacturing method for the gate electrode according to claim 1, wherein the temperature in the reaction chamber of the atomic layer deposition apparatus is 400-600° C., and the vacuum degree in the reaction chamber of the atomic layer deposition apparatus is 0.01-0.05 torr.

5. The manufacturing method for the gate electrode according to claim 1, wherein the preset time period for continuously introducing the molybdenum precursor is between 0.01 and 0.5 seconds;
   the preset time period for remaining the molybdenum precursor after the introduction is 2-20 s;
   the preset time period for introducing the reducing gas is between 0.005 and 0.3 seconds;
   the preset time period for remaining the reducing gas after the introduction is 2-20 s;
   the time for introducing the inert gas for purging is between 5 and 30 seconds;
   the preset number of times is 30-1000.

6. The manufacturing method for the gate electrode according to claim 5, wherein the preset time period for continuously introducing the molybdenum precursor is 0.02 s.

7. The manufacturing method for the gate electrode according to claim 5, wherein the rate for introducing the molybdenum precursor is 20 sccm, and the molybdenum precursor and the reducing gas are introduced at the same rate.

8. The manufacturing method for the gate electrode according to claim 5, wherein the preset number of cycles is 50.

9. The manufacturing method for the gate electrode according to claim 5, wherein the reducing gas reduces the molybdenum precursor to elemental molybdenum, and the reducing gas is carbon monoxide.

10. The manufacturing method for the gate electrode according to claim 1, wherein the thickness of the aluminum film is greater than that of the molybdenum film.

11. The manufacturing method for the gate electrode according to claim 1, wherein the thickness of the deposited aluminum film is 100 Å-450 Å.

12. The manufacturing method for the gate electrode according to claim 1, wherein the physical vapor deposition is performed by magnetron sputtering, the magnetron sputtering employs DC/AC sputtering, and argon is used as the sputtering gas.

13. A manufacturing method for a thin film transistor, comprising:
    S1: forming an aluminum film on a substratum through magnetron sputtering;
    S2: placing the substratum with the aluminum film in a reaction chamber of an atomic layer deposition apparatus;
    S3: continuously introducing a molybdenum precursor for a preset time period into the atomic layer deposition apparatus, remaining for a preset time period after the introduction, and introducing an inert gas for purging;
    S4: continuously introducing a reducing gas for a preset time into the atomic layer deposition apparatus, remaining for a preset time period after the introduction, and introducing the inert gas for purging;

S5: repeating the steps S3 and S4 for a preset number of times to form a molybdenum film;

S6: etching the aluminum film and the molybdenum film to form the gate electrode of a predetermined pattern; and S7: sequentially forming an insulating layer, a semiconductor layer, source and drain electrodes and a passivation layer above the gate electrode to form the thin film transistor.

* * * * *